United States Patent
Bol et al.

(10) Patent No.: US 7,811,906 B1
(45) Date of Patent: Oct. 12, 2010

(54) CARBON-ON-INSULATOR SUBSTRATES BY IN-PLACE BONDING

(75) Inventors: Ageeth A. Bol, Yorktown Heights, NY (US); Jack O. Chu, Yorktown Heights, NY (US); Alfred Grill, Yorktown Heights, NY (US); Conal E. Murray, Yorktown Heights, NY (US); Katherine L. Saenger, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/612,331

(22) Filed: Nov. 4, 2009

(51) Int. Cl.
*H01L 21/36* (2006.01)
*H01L 21/20* (2006.01)
*H01L 21/44* (2006.01)
*H01L 21/31* (2006.01)

(52) U.S. Cl. ............... 438/478; 438/577; 438/758; 438/761; 257/E21.09; 257/E21.27

(58) Field of Classification Search ............ 257/E21.09, 257/E21.27
See application file for complete search history.

(56) References Cited

U.S. PATENT DOCUMENTS

2010/0021708 A1* 1/2010 Kong et al. ............... 428/220

OTHER PUBLICATIONS

Reina, A. et al. "Large Area, Few-Layer Graphene Films on Arbitrary Substrates by Chemical Vapor Deposition", Nano Letters published online on Dec. 1, 2008, vol. 9, No. 1, 30-35.
Reina, A. et al., "Transferring and Identification of Single and Few-Layer Graphene on Arbitrary Substrates", J. Phys. Chem. C, Oct. 24, 2008, 112 (46), 17741-17744.
Levendorf, M.P., et al., "Transfer-Free Batch Fabrication of Single Layer Graphene Transistors" Nano Lett., Article ASAP, Oct. 27, 2009, American Chemical Society.
Mastrangelo, C.H., et al., "Mechanical Stability and Adhesion of Microstructures under Capillary Forces—Part II: Experiments," Journal of Microelectromechanical Systems, 1993, vol. 2, No. 1,p. 44.
Ishigami, M., et al., "Atomic Structure of Graphene on SiO2," Nano Letters, 2007, 7, p. 1643.

* cited by examiner

*Primary Examiner*—Charles D Garber
*Assistant Examiner*—Mohsen Ahmadi
(74) *Attorney, Agent, or Firm*—Scully, Scott, Murphy & Presser, P.C.; Louis J. Percello, Esq.

(57) ABSTRACT

An in-place bonding method in which a metal template layer under a carbon layer is removed while the carbon layer is still attached to a substrate is described for forming a carbon-on-insulator substrate. In one embodiment of the in-place bonding method, at least one layered metal/carbon (M/C) region is formed on an insulating surface layer of an initial substrate structure. The at least one layered M/C region has edges that are bordered by exposed regions of the insulating surface layer. Some edges of the at least one layered M/C region are then secured to a base substrate of the initial structure via a securing structure, while other edges are left exposed. A selective metal etchant removes the metal layer under the carbon layer using the exposed edges for access. After metal etching, the now-unsupported carbon layer bonds to the underlying insulating surface layer by attraction.

24 Claims, 6 Drawing Sheets

CARBON-ON-INSULATOR SUBSTRATES BY IN-PLACE BONDING

STATEMENT REGARDING FEDERALLY SPONSORED RESEARCH OF DEVELOPMENT

This invention was made with Government support under Contract No.: FA8650-08-C-7838 awarded by Defense Advanced Research Projects Agency (DARPA). The Government has certain rights in this invention.

BACKGROUND

The present invention relates to semiconductor device fabrication. More particularly, the present invention relates to a method of forming a carbon-on-insulator substrate utilizing an in-place bonding method.

The exceptionally high intrinsic carrier mobility of graphene makes it a potentially promising material for high frequency electronic devices such as low-noise amplifiers for communication applications. However, existing methods to prepare the required single-layer or few-layer graphene are far from ideal. Graphene from exfoliation of graphite provides a good quality material, but the yield is low and the inspection requirements are daunting. Graphene layers prepared by thermal treatment of a single crystal SiC layer can provide large area graphene, but processing is difficult (given the requirements for temperatures exceeding 1100° C.-1200° C.) and the SiC template crystals are expensive and limited in size.

Chemical vapor deposition methods for forming graphene on various metal template layers such as Ni have recently been demonstrated and appear promising. See, for example, A. Reina et al. "Large Area, Few-Layer Graphene Films on Arbitrary Substrates by Chemical Vapor Deposition," in Nano Letters 9, 30 (2009). However, since device layer graphene must be situated on an insulating substrate, the graphene cannot remain on the metal layer on which the graphene has been grown.

This problem has been previously addressed by coating a polymer layer such as, for example, PMMA (polymethyl methacrylate) on the graphene surface and then performing various processing steps to produce a free-standing PMMA-graphene couple which is then bonded graphene face down to a substrate such as thermally oxidized silicon. See, for example, the publication to A. Reina et al. mentioned above as well as the publication to A. Reina et al. entitled "Transferring and Identification of Single and Few-Layer Graphene on Arbitrary Substrates," J. Phys. Chem. C 112 17741 (2008). While such a transfer/bonding method can be used in forming a graphene-on-insulator substrate, it is not expected to scale well into large areas.

It would therefore be desirable to have a robust and scalable method for transferring and bonding graphene formed on a metal layer to an insulating substrate or insulating substrate layer.

SUMMARY

An in-place bonding method in which a metal template layer under a carbon layer is removed while the carbon layer is still attached to a substrate is described for forming a carbon-on-insulator substrate. In one embodiment of the in-place bonding method of the present application, at least one layered metal/carbon region is formed on an insulating surface layer of a base substrate. The at least one layered metal/carbon (M/C) region has its location and lateral dimensions defined by a patterning process that leaves the region with edges that are bordered by exposed regions of the insulating surface layer. The patterning process may be subtractive (e.g., blanket deposition followed by selective removal), additive (e.g., selective deposition or deposition through a removable mask), or some combination of additive and subtractive (e.g., subtractive patterning of the metal layer followed by selective deposition of carbon on the patterned metal). Some edges of the at least one layered M/C region are then secured to the base substrate by one or more securing structures, while other edges are typically left exposed. A selective etchant removes the metal layer under the carbon layer using the exposed edges for access. After metal etching, the now-unsupported carbon layer bonds to the underlying insulating surface layer by attractive forces.

In some embodiments, and when the layered M/C region includes a carbon layer that is porous, the securing structures can secure all of the edges. In this embodiment, the selective etchant removes the metal layer of the layered M/C region by entering through the pores within the carbon layer.

One possible advantage of the aforementioned in-place bonding approach for forming carbon-on-insulating substrates is that it avoids the trouble of handling and aligning free-standing layers. The above in-place bonding method is also expected to be preferred over conventional bonding techniques in which a carbon layer is transferred from a surface of one rigid substrate to a surface of another rigid substrate, since such methods typically require extremely clean, flat surfaces and may have low transfer yields. Another possible advantage of the in-place bonding method described in this application is that the securing structures may be used as alignment marks to locate the in-place bonded carbon regions since those regions may have poor contrast relative to a bare substrate.

In one aspect of the invention, a method of forming a carbon-on-insulator substrate is provided that includes providing an initial structure including an insulating surface layer on a base substrate. At least one layered metal/carbon (M/C) region is provided on the insulating surface layer. The at least one layered M/C region includes an upper patterned carbon layer and a lower patterned metal layer. Moreover, the at least one layered M/C region has edges bordered by exposed regions of the insulating surface layer. Securing structures are provided to secure some edges of the at least one layered M/C region to the base substrate, while leaving other edges of the at least one layered M/C region exposed and unsecured. Each securing structure includes a securing material disposed over some portion of at least one layered M/C region edge and some portions of both the at least one layered M/C region and the insulating surface layer directly adjacent the at least one layered M/C region edge. The patterned metal layer of the at least one layered M/C region is selectively removed by an etching process wherein etchants used have access to the patterned metal layer via the unsecured edges of the at least one layered M/C region. After the selective etching, the patterned carbon layer is allowed to bond to the insulating substrate layer after a desired amount of metal has been selectively removed.

In some embodiments of the invention, the securing structures are removed after bonding. In other embodiments of the present invention, the securing structures remain within the structure after bonding.

DETAILED DESCRIPTION

The present invention, which provides a method for forming a carbon-on-insulator substrate utilizing an in-place bonding method, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Reference is first made to FIGS. 1-7 which illustrate the basic processing steps of the in-place bonding method that can be used in forming a carbon-on-insulator structure in accordance with one embodiment of the present invention. Specifically, FIGS. 1-7 depict an in-place bonding method in which a metal template layer under a carbon layer is removed while the carbon layer is still attached to an initial substrate structure. A metal/carbon layer located on an insulating surface layer of a base substrate is patterned to form at least one layered metal/carbon (M/C) region having edges that are bordered by exposed regions of the insulating surface layer. Some edges of the layered M/C regions are then secured to the base substrate of the initial substrate structure via a securing structure, while other edges are left exposed. A selective etchant removes the metal layer under the carbon layer using the exposed edges for access. After metal etching, the now-unsupported carbon layer bonds to the underlying insulating surface layer by attraction.

Figure 1:
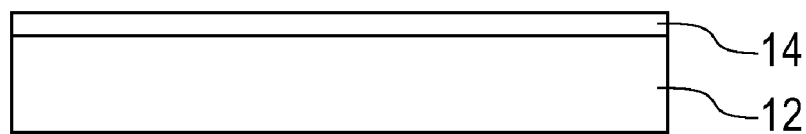
FIG. 1 is a pictorial representation (through a cross sectional view) illustrating an initial structure that can be employed in one embodiment of the invention.

Referring now to FIG. 1, there is illustrated an initial structure 10 that can be employed in one embodiment of the invention. The initial structure 10 includes an insulating surface layer 14 that is located on a base substrate 12. In one embodiment of the invention, the base substrate 12 may include a semiconductor material which can be selected from, but not limited to, silicon, a silicon-germanium alloy, a silicon-carbon alloy, a silicon-germanium-carbon alloy, and other semiconductor materials. In some embodiments of the invention, the base substrate 12 includes a semiconductor-on-insulator substrate such as, for example, a silicon-on-insulator (SOI) or a silicon-germanium-on-insulator (SGOI). In other embodiments of the invention, the base substrate 12 is composed of a conductive material such as a metal. In yet other embodiments, the base substrate 12 includes a multi-layered stack of a semiconductor material and a conductive material. Base substrate 12 is preferably thermally stable enough to survive the high temperature (typically 900° C.-1100° C.) steps typically required for forming carbon layers with the desired phase and microstructure. The thickness of the base substrate 12 that is employed can vary. Typically, the thickness of the base substrate 12 is from 50 microns to 1 mm.

The insulating surface layer 14 of the initial structure 10 can be comprised of any insulating material including, but not limited to, an oxide, a nitride, an oxynitride, or multilayered stacks thereof. In one embodiment, the insulating surface layer 14 is comprised of an insulating oxide, with silicon oxide being preferred. In another embodiment, the insulating surface layer 14 is comprised of an insulating metal oxide, with aluminum oxide being preferred.

In some embodiments, the insulating surface layer 14 can be formed by a deposition process such as, for example, chemical vapor deposition (CVD), plasma enhanced chemical vapor deposition (PECVD), atomic layer deposition (ALD), lamination, chemical solution deposition, and physical vapor deposition (PVD) methods including evaporation, reactive evaporation, sputtering and reactive sputtering. Alternatively, the insulating surface layer 14 can be formed by a thermal process including, for example, oxidation and/or nitridation. The thickness of the insulating surface layer 14 may vary depending on the type of insulating material used in forming the insulating surface layer 14 and the technique that was used in forming the same. Typically, the insulating surface layer 14 has a thickness from 10 nm to 500 nm, with a thickness from 100 nm to 300 nm being more typical.

Figure 2:
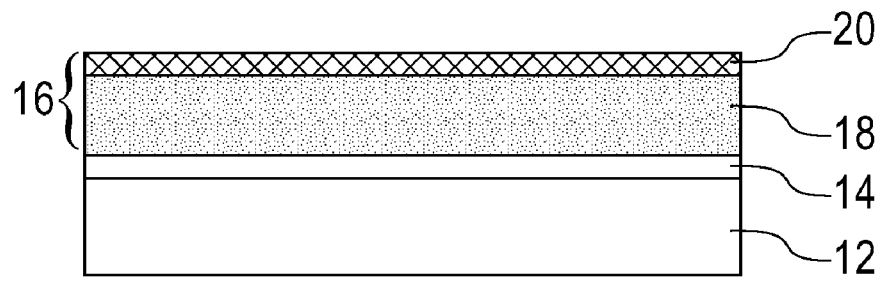
FIG. 2 is a pictorial representation (through a cross sectional view) illustrating the initial structure of FIG. 1 after forming a material stack thereon, said material stack including, from bottom to top, a metal layer and a carbon layer.

Referring now to FIG. 2, there is illustrated the structure of FIG. 1 after forming a material stack 16 on an upper surface of the insulating surface layer 14 of the initial structure 10. The material stack 16 includes, from bottom to top, a lower metal layer 18 and an upper carbon layer 20. As is shown, the upper carbon layer 20 is situated directly on an upper surface of the metal layer 18. The metal layer 18 of material stack 16 can be formed utilizing a deposition process including, but not limited to, CVD, PEVCD, PVD, ALD, chemical solution deposition, plating, and combinations thereof. The metal layer 18 of material stack 16 may include elemental metals, metal alloys, metal silicides and germanides, metal carbides, and combinations thereof, with elemental metals being preferred. Examples of metals that can be contained within the metal layer 18 include, but are not limited to, Co, Cu, Fe, Ir, Mo, Ni, Pt, Ru; alloys of these metals with other elements, and other metals and their alloys. The metal layer 18 may further include layered combinations of the aforementioned materials as well as these metals in combination with sacrificial underlayers (introduced, for example, as adhesion layers and/or diffusion barriers) which may or may not be metallic. In one embodiment of the invention, the metal layer 18 is a Ni layer. In another embodiment, the metal layer is a Cu layer.

The thickness of the metal layer 18 of material stack 16 can vary depending on the type of metal contained within the metal layer and the technique used in forming the same. Typically, the metal layer 18 has a thickness from 30 nm to 1000 nm, with a thickness from 100 nm to 500 nm being more typical.

In preferred embodiments of the invention, the upper carbon layer 20 of material stack 16 comprises at least one layer of graphene. The term "graphene" is used herein to denote a one-atom-thick planar sheet of $sp^2$-bonded carbon atoms that are densely packed in a honeycomb crystal lattice. The at least one layer of graphene can be comprised of single-layer graphene (nominally 0.34 inn thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases. The at least one layer of graphene may also include, if desired, substitutional, interstitial and/or intercalated dopant species as well. Single and few-layer graphene sheets within the carbon layer typically have lateral dimensions ranging from a few microns to several tens of microns, and typically overlap enough to provide at least 95% coverage of the underlying metal layer. While carbon layers comprising discontinuous islands of graphitic carbon (ranging from 1 to >10 graphene layers) may be transferred in some embodiments of this invention, a discontinuous island morphology for the carbon layer 20 is generally not preferred.

The upper carbon layer 20 of material stack 16 may be formed utilizing techniques that are well known in the art for forming a carbon layer of the types mentioned above. For example, carbon layer 20 may be formed by a CVD process such as that described by A. Reina et al.

The thickness of the carbon layer 20 of material stack 16 can vary depending on, for example, the type of technique used in forming the same. Typically, the carbon layer 20 has a thickness from 0.34 nm to 100 nm, with a thickness from 0.34 nm to 3.4 nm being more typical.

In some embodiments of the present invention, the carbon layer 20 includes other structures (not specifically shown) on, or within, the carbon layer 20. The other structures that can be present on or within the carbon layer 20 include, but are not limited to, carbon field effect transistors, sacrificial protective coatings, and coatings that may become part of a dielectric gate stack. The formation of the other structures on, or within, the carbon layer 20 is well known to those skilled in the art. As such, details concerning the formation of the other structures on or within the carbon layer are not provided herein.

Figure 3:
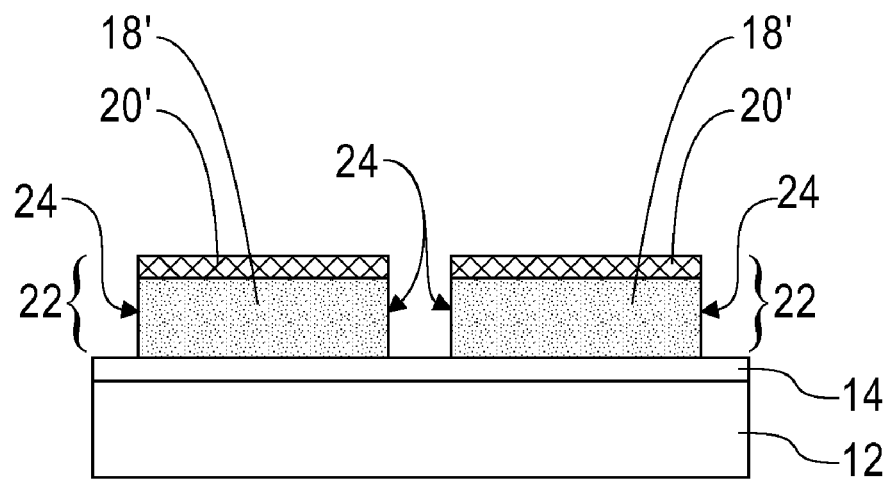
FIG. 3 is a pictorial representation (through a cross sectional view) of the structure of FIG. 2 after forming at least one layered metal/carbon region from the material stack on an upper surface of the initial structure.

Referring now to FIG. 3, there is illustrated the structure of FIG. 2 after forming at least one layered metal/carbon (M/C) region 22 on the insulating surface layer 14. As shown in FIG. 3, the at least one layered M/C region 22 includes a patterned portion of the upper carbon layer 20 (i.e., patterned carbon layer 20') and a patterned portion of the lower metal layer 18 (i.e., patterned metal layer 18') of material stack 16. As would be seen from a top-down view, the at least one layered M/C region 22 has edges 24 that are bordered by exposed regions of the insulating surface layer 14. The at least one layered M/C region 22 may be formed by a subtractive patterning process that might include lithography and etching. Lithography includes the steps of applying a photoresist (not shown) to the upper surface of carbon layer 20, exposing the photoresist to a desired pattern of radiation and developing the exposed photoresist material utilizing a conventional resist developer. The etching includes dry etching, wet etching or a combination of dry and wet etching. When dry etching is employed, the dry etch can include reactive ion etching, plasma etching, ion beam etching or laser ablation. When wet etching is performed, at least one wet chemical etchant is used that selectively removes exposed portions of the material stack 16 that do not include the patterned resist. The patterned resist is removed after etching utilizing a conventional wet stripping process in a solvent such as, for example, n-methylpyrrolidone, which is well known to those skilled in the art.

In certain cases, subtractive patterning might include a selected-area delamination instead of etching. Alternatively, the at least one layered metal/carbon region 22 may be formed by an additive patterning process in which one or more of the component metal and carbon layers are deposited in selected regions only. For example, patterned metal layer 18' of the at least one layered M/C region 22 can be deposited by evaporation through a mask while patterned carbon layers 20' can be selectively deposited on patterned metal layers 18' by a CVD process. In some embodiments, a combination of a subtractive and additive patterning can be employed.

The shape of the at least one layered M/C region 22 can vary depending on the conditions of the patterning process used. Typically, the shape of the at least one layered M/C region 22 is selected from a set of shapes including dots, squares, ovals, rings, rectangles and combinations thereof. In some embodiments, and as is shown in FIG. 3, the shape of the at least one layered M/C region 22 is a rectangle.

The optimum lateral dimensions of the at least one layered M/C region 22 depend on several factors and reflect a compromise between the desire to have large-sized (of order $cm^2$) carbon-on-insulator regions and the need to remove the metal underlayer in a reasonable amount of time. For cases in which the etchant can only come in from the edges of the at least one M/C region, shapes having a large perimeter to area ratio are preferred, for example a rectangle of dimensions 40 um×1 cm rather than a square with the same area having 2 mm edges. If long etch times are not a concern, large die-sized regions of dimensions 2 cm×2 cm might be preferred. For cases where the dimensions of the at least one layered M/C region are very small (all lateral dimensions <10 um), or the layers very thick (e.g., metal >500 nm and/or carbon >100 nm), additional factors come into play. Specifically, one needs to consider the possibility that the subsequent unsupported carbon layer will be too stiff to deflect enough to contact to the substrate. The amount of deflection required is nominally equal to the thickness of the metal layer, which defines the initial distance between the carbon layer and the substrate surface; the force required for a given deflection increases as the thickness and modulus of the carbon layer increases and as the lateral dimensions of the carbon layer decrease. Quantitative expressions to evaluate these effects may be found in C. H. Mastrangelo and C. H. Hsu, "Mechanical Stability and Adhesion of Microstructures under Capillary Forces—Part II: Experiments," J. Microelectromechanical Systems 2, 44 (1993) with values for specific parameters available in M. Ishigami et al., "Atomic Structure of Graphene on SiO2," Nano Letters 7, 1643 (2007).

Figure 4:
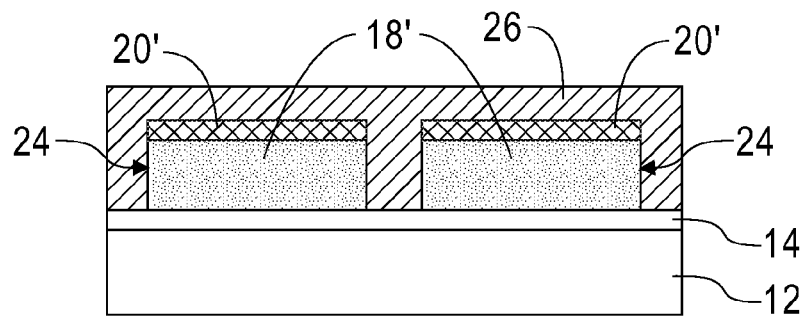
FIG. 4 is a pictorial representation (through a cross sectional view) illustrating the structure of FIG. 3 after providing a blanket layer of a securing material to all exposed surfaces of the structure shown in FIG. 3.

Referring to FIG. 4, there is shown the structure of FIG. 3 after forming a securing material 26 on all exposed surfaces of the structure including atop exposed surfaces of the insulating surface layer 14 and atop the at least one layered M/C region 22. Specifically, and as shown in FIG. 4, the securing material 26 is disposed over some portion of the at least one layered M/C region edge 24 and some portion of the least one layered M/C region 22 and the insulating surface layer 14 directly adjacent the at least one layered M/C region edge 24. When more than one layered M/C region 22 is formed, the securing material 26 can fill the gap between neighboring layered M/C regions as shown in FIG. 4.

The securing material 26 can comprise any material that can be easily patterned and/or removed without damaging the underlying patterned carbon layer 20' or the insulating surface layer 14. Examples of typical securing materials that can be employed in the present invention include materials selected from polymethyl methacrylate (PMMA), polydimethylsiloxane (PDMS) and a photoresist. In some embodiments, the securing material 26 includes multilayers of one of the aforementioned materials. Of these listed securing materials, and in one embodiment of the invention, it is preferred to use PMMA as the securing material 26. If desired, the securing structures may be given various surface treatments, before or after patterning, to improve wetting behavior in the etchant. For example, a short oxygen plasma treatment can be used to improve the wetability of PMMA in aqueous etchants.

The securing material 26 is typically impermeable to the etchant used to selectively remove the patterned metal layer 18' of the at least one layered M/C region 22. The time for complete removal of the patterned metal layer 18' from the layered M/C regions 22 will depend on various geometrical factors as well as the permeability of the carbon layer to the etchant. When the lateral dimensions of the at least one layered M/C region 22 are large (e.g., 1 cm×1 cm) and access to the metal is only through the non-secured edges of the at least one layered M/C region 22, removal will may take several hours or more. In contrast, metal removal may be on the order of minutes for case in which the carbon layer is porous and the securing structures cover only a small fractional area of the at least one layered M/C region 22. If both the securing material 26 and the carbon layer are porous, metal removal may be fast even when the securing structures cover a large fractional area of the at least one layered M/C region.

The securing material 26 can be disposed on the structure shown in FIG. 3 utilizing a conventional deposition process including, but not limited to, spin-coating, spray-coating, screen printing, evaporation, chemical solution deposition, dip coating, CVD and PECVD. The thickness of the securing material 26 can vary depending on the type of securing material employed and the technique used in forming the same. Typically, the securing material 26 has a thickness from 50 nm to 10 um, with a thickness from 100 nm to 2 um being more typical.

Figure 5A:
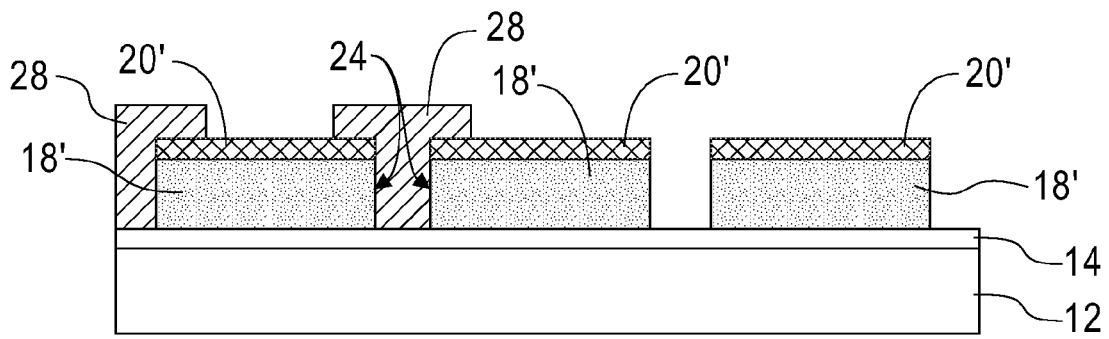
FIGS. 5A and 5B are pictorial representations (through a cross sectional view and a top-down view, respectively) showing the structure of FIG. 4 after patterning the securing material into a securing structure that protects some edges of the at least one layered metal/carbon region, while leaving other edges of the at least one layered metal/carbon region unprotected and unsecured.
Figure 5B:
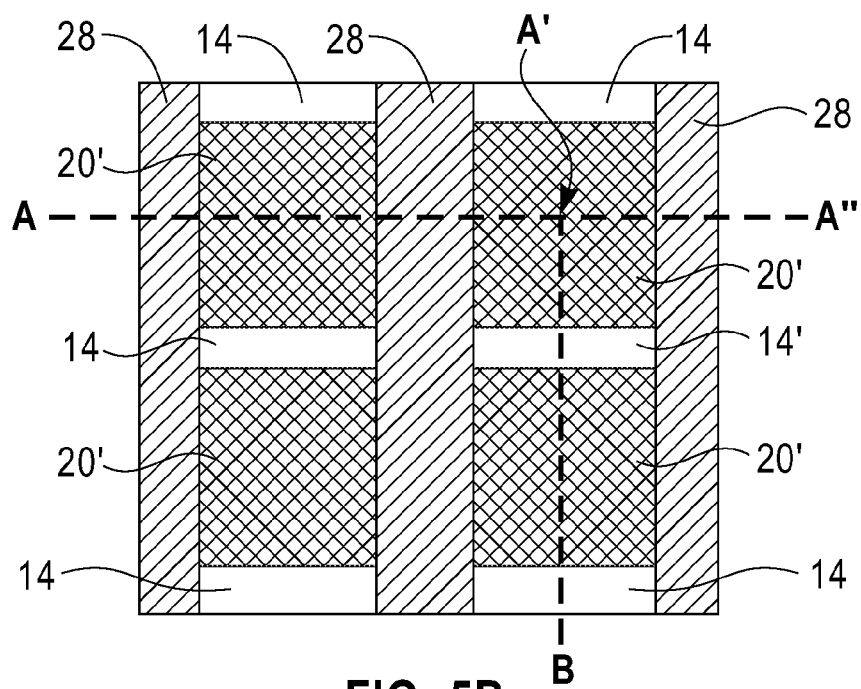

Referring now to FIGS. 5A-5B, there is illustrated the structure of FIG. 4 after forming patterned securing structures 28 which secure some edges 24 of the at least one layered M/C region 22 to the insulating surface layer 14 that is located atop base substrate 12, while leaving other edges 24 of the at least one layered M/C region 22 exposed and unsecured. It is observed that the drawing of FIG. 5A is a cross section along dotted line A-A'-B, whereas the cross section of FIG. 4 is a cross section along dotted line A-A'-A". It is further observed that the securing structures 28 ensure that the patterned carbon layer 20' does not float away during the subsequent removal of the underlying patterned metal layer 18'.

The patterning step used in patterning the securing material 26 into securing structures 28 would typically include lithography and optionally etching. The optional etching step is employed when the securing material is comprised of a material other than a photoresist. Alternatively, the securing structures 28 may be formed in selected areas only by additive processes which might include "direct-write" processes such as dispensing droplets of PMMA with a pipette, or patterned deposition processes such as spray deposition through a mask.

The shape of the securing structures 28 can vary depending on the conditions of the patterning process used. Typically, the shape of the securing structures 28 is selected from a set of shapes including dots, squares, ovals, rings, rectangles and combinations thereof. In some embodiments, and as is shown in FIG. 5B, the shape of the securing structures 28 is a rectangle.

In some embodiments of the invention and as shown in FIG. 5A, at least one securing structure secures opposing edges of the at least one layered M/C region to the insulating surface layer and substantially covers those portions of that layered M/C region lying between the opposing edges, thereby improving the resistance of the M/C and/or carbon layers between the secured edges to stress-induced tearing and breakup that can occur before the metal layer removal is complete.

For cases in which carbon layer is porous and permeable to the etchant, some of the securing structures 28 provided may secure all edges 24 of the at least one layered M/C region 22, leaving no edges 24 of the at least one layered M/C region 22 exposed and unsecured.

Figure 8A:
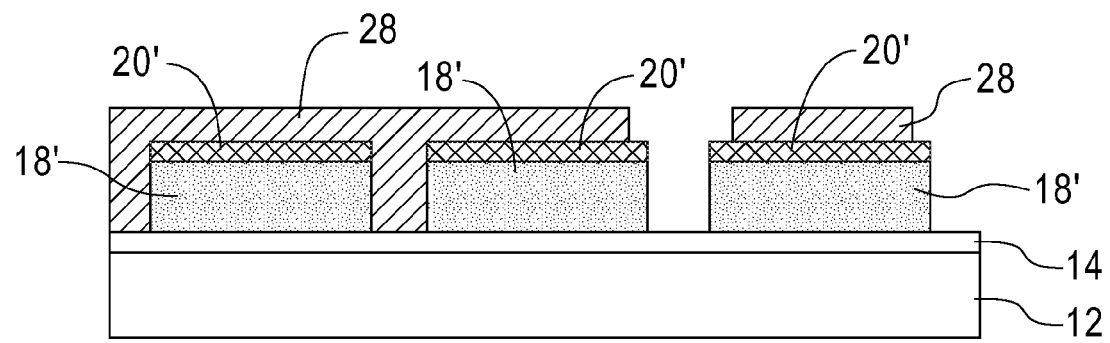
FIGS. 8A and 8B are pictorial representations (through a cross sectional view and a top-down view, respectively) showing one alternative securing structure that can be formed in the present invention.
Figure 8B:
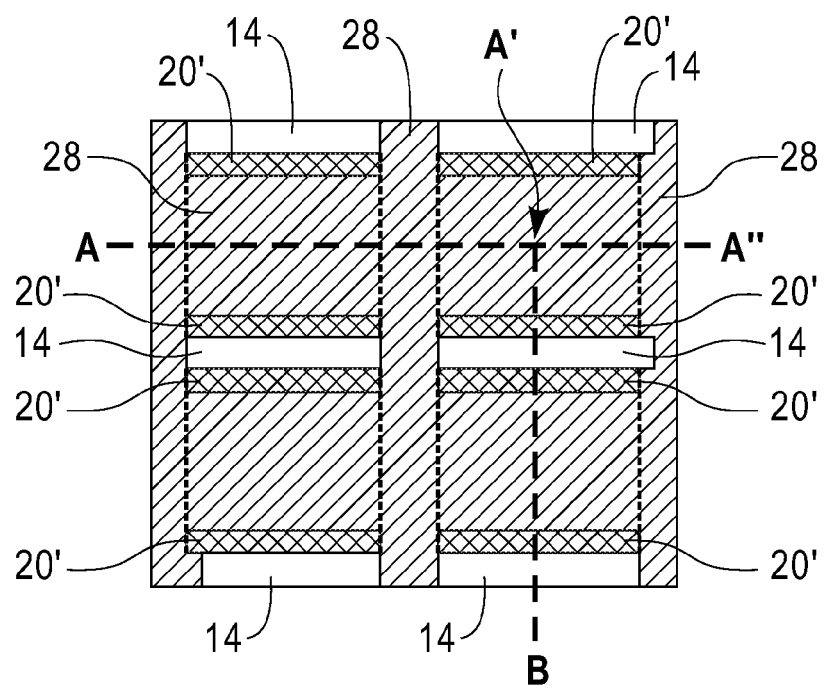
Figure 9A:
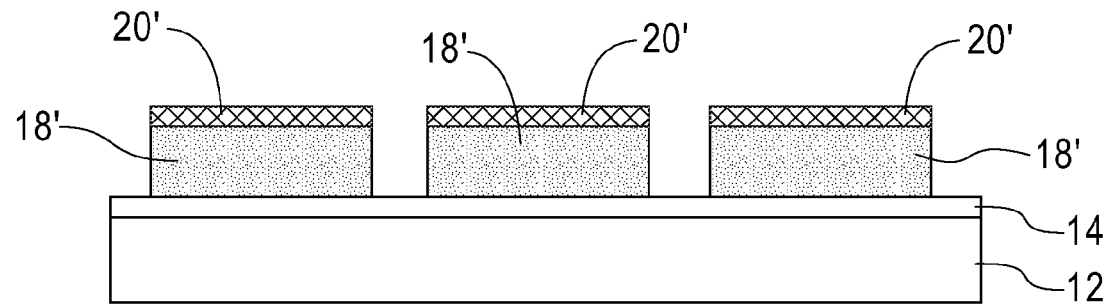
FIGS. 9A and 9B are pictorial representations (through a cross sectional view and a top-down view, respectively) showing another alternative securing structure that can be formed in the present invention.
Figure 9B:
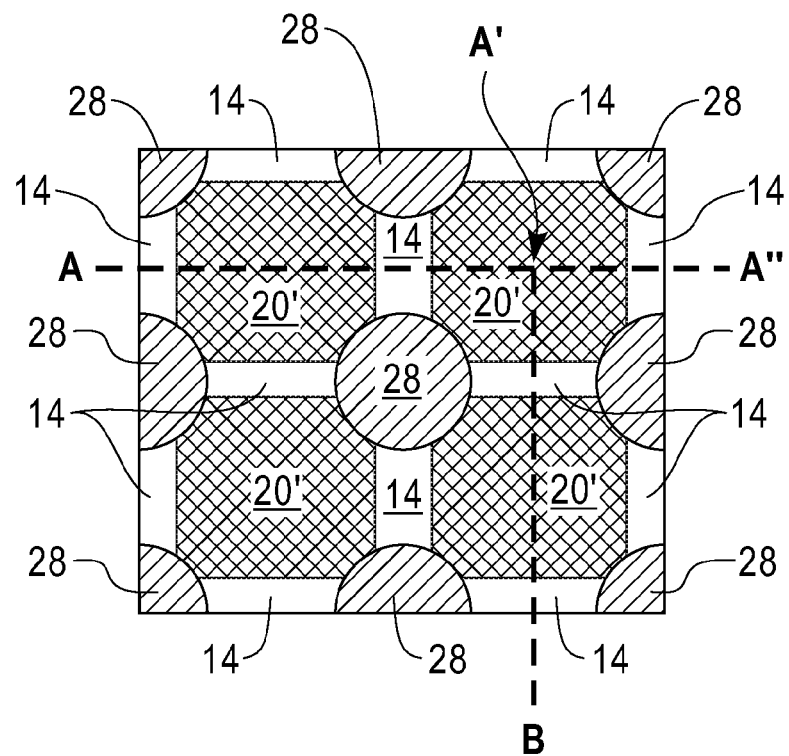
Figure 10A:
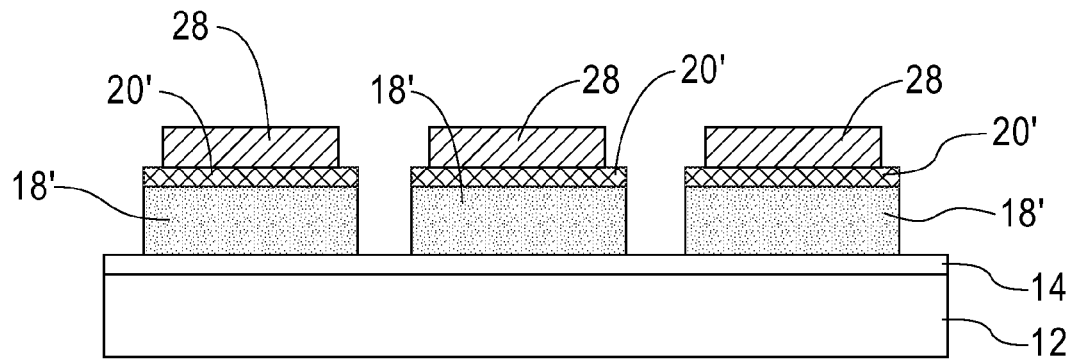
FIGS. 10A and 10B are pictorial representations (through a cross sectional view and a top-down view, respectively) showing yet another alternative securing structure that can be formed in the present invention.
Figure 10B:
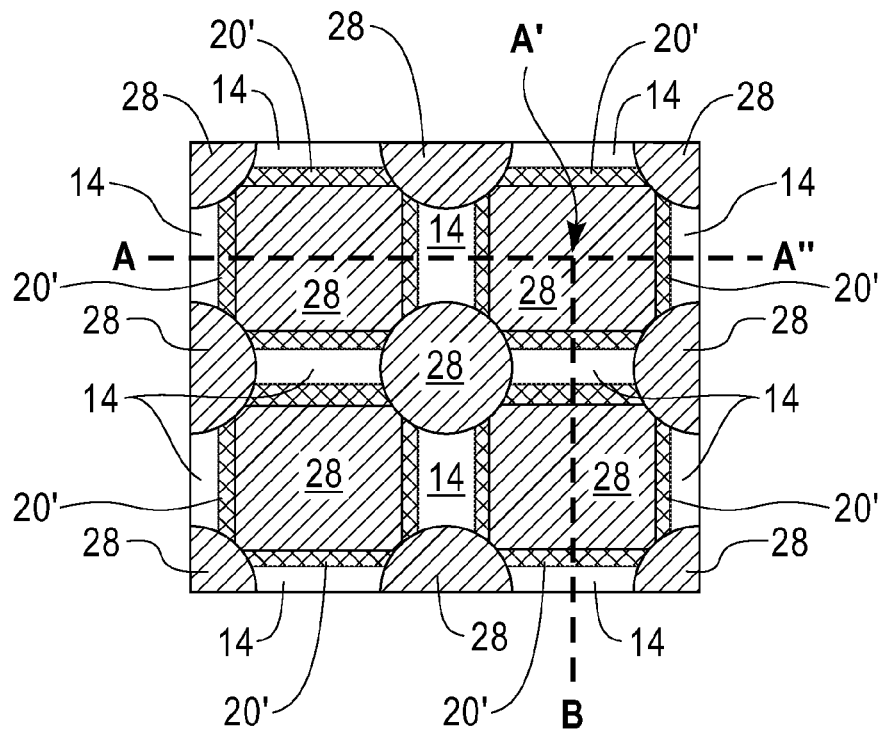

In addition to the securing structures shown in FIGS. 5A-5B, the present application also includes embodiments in which the securing structures 28 shown in FIGS. 8-10 are formed, wherein FIGS. 8A, 9A, and 10A are cross-section views of the top-view drawings of FIGS. 8B, 9B, and 10B along dotted lines A-A'-B. The alternative securing structures are formed utilizing the processing steps mentioned above.

The securing structures of FIGS. 8A-8B are similar to those of FIGS. 5A-5B in how the opposing edges of the M/C regions are secured, but differ from the securing structures of FIGS. 5A-5B in that the securing structures of FIGS. 8A-8B extend over and substantially cover those portions of the layered M/C regions between the opposing M/C region edges. This geometry improves the resistance of the M/C and/or carbon layers between the secured edges to stress-induced tearing and breakup that can occur before the metal removal is complete. It is particularly useful when the carbon layer is mechanically weak and/or discontinuous.

The securing structures of FIGS. 9A-9B are similar to those of FIGS. 5A-5B in that they secure edges of the layered M/C regions without substantially covering those portions of the layered M/C regions between opposing edges, but differ from the securing structures of FIGS. 5A-5B in that they cover a smaller proportion of the total available length of the layered M/C region edges. This geometry may be preferred to the geometry of FIGS. 5A-5B when the metal etch rate is limited by lack of sufficient exposed edge area, but shares the requirement that the carbon layer be mechanically strong enough to survive the metal etching process. When the carbon layer is both mechanically strong and permeable to the metal etchant, the securing structure geometries of FIGS. 5A-5B and FIGS. 9A-9B have the additional advantage compared to the securing structures of FIGS. 8A-8B that metal etching can now occur from the top of the layered M/C regions as well as from the sides.

The securing structures of FIGS. 10A-10B show yet another example of possible securing structure geometry. Specifically, FIGS. 10A-10B illustrate how the smaller proportion of the total available length of M/C region edges feature of the FIGS. 9A-9B securing structures may be combined with the top surface coverage feature of the FIGS. 8A-8B securing structures.

It is noted that in cases wherein the carbon layer is permeable to the etchant, the in-place bonding method of this invention may be implemented with securing structures provided on all edges of the at least one layered M/C region. In this geometry, the metal etching proceeds through the top surface only.

Figure 6:
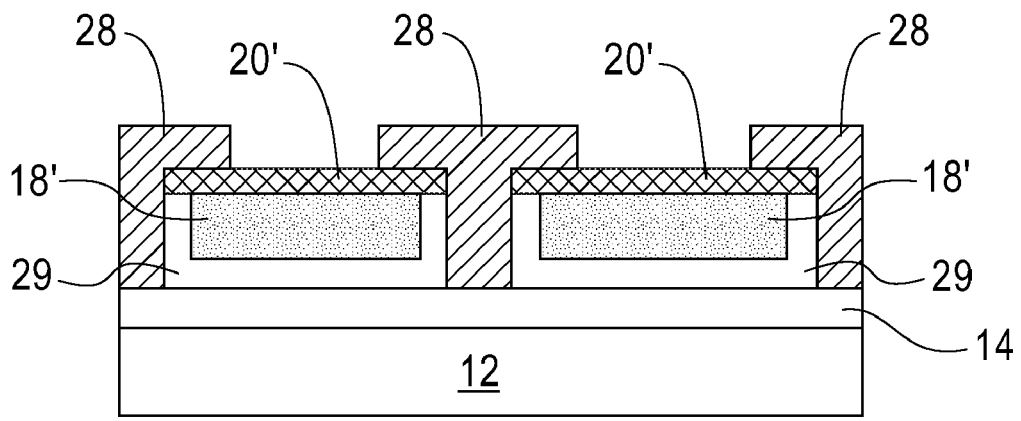
FIG. 6 is a pictorial representation (through a cross sectional view) of the structure of FIGS. 5A-5B after selectively removing the metal layer from the at least one layered metal/carbon region.

Referring now to FIG. 6, there is shown the structures of FIGS. 5A-5B during the selective removal of the patterned metal layer 18' from the at least one layered M/C region 22. In FIG. 6, reference numeral 29 denotes a gap that is formed during the selective removal of the patterned metal layer 18'. The selective removal of the patterned metal layer 18' from that at least one layered M/C region 22 is achieved by an etching process wherein the etchants used have access to the patterned metal layer 18' via the unsecured edges of the at least one layered M/C region 22. When the carbon layer is permeable to the etchant, the metal removal may be effected through the top of the patterned metal layer 18' as well as to its sides.

The preferred etchant will depend on the chemical properties of the particular metal to be removed. Illustrative types of etchants that might be used for metal removal for cases in which metal layer 18 is Ni include one of aqueous HCl and aqueous FeCl$_3$.

Figure 7A:
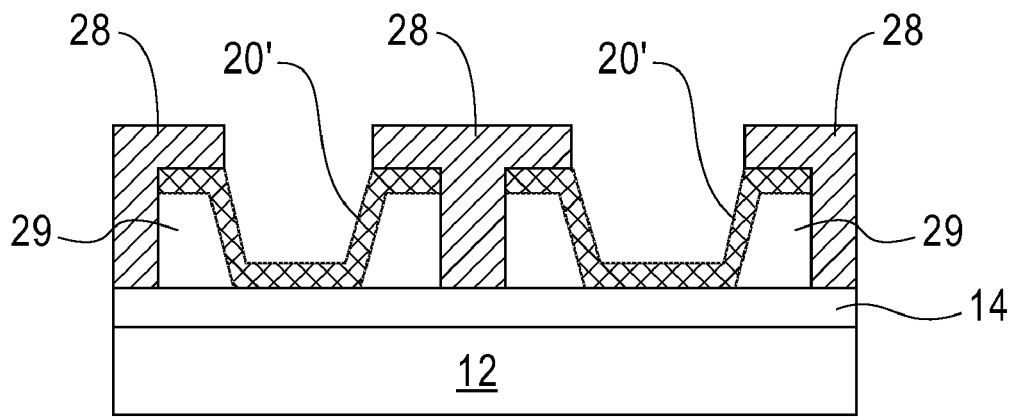
FIGS. 7A and 7B are pictorial representations (through a cross sectional view) of the structure of FIG. 6 after in-place bonding occurs.

Referring now to FIG. 7A, there is illustrated the structure of FIG. 6 after the patterned metal layer 18' has been completely removed and after allowing the patterned carbon layer 20' to bond to the insulating surface layer 14. The bonding of the patterned carbon layer 20' to the underlying insulating surface layer 14 occurs spontaneously by an attractive force such as, for example, van der Waals force of attraction. In some embodiments of the invention, the bonding of the patterned carbon layer 20' to the insulating surface layer 14 can be assisted by an externally applied force such as, for example, a pulse of pressurized gas.

During and/or following the removal of the patterned metal layer 18' from the structure, various rinsing and drying steps can be performed to remove any metal etch residues from the top and bottom surfaces of the patterned carbon layer 20' before bonding.

Figure 7B:
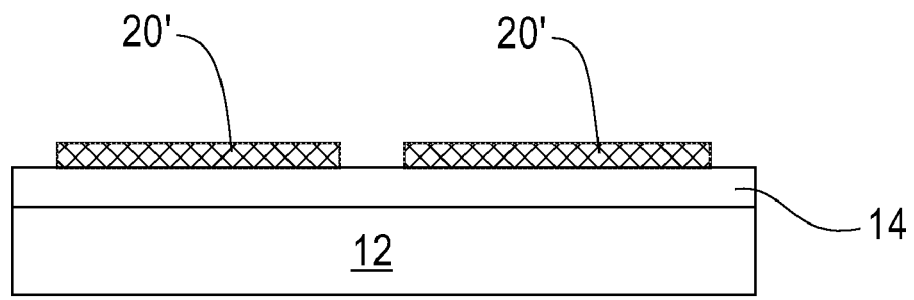

In some embodiments of the present invention, the securing structures 28 remain in the structure, as shown in FIG. 7A. In yet other embodiments of the invention, the securing structures 28 are removed from structure, as shown in FIG. 7B. When the securing structures 28 are removed from the structure, the removal can be achieved by a process selected from a wet method and a dry method. Removal is preferably selective in that the securing structure is removed while leaving desired portions of the patterned carbon layer. In one embodiment and when a wet method is used, the wet method includes dissolution of the securing structures 28 by immersion in an organic or inorganic solvent. An example of a wet method for removing securing structures formed from PMMA is immersion in acetone. In another embodiment of the invention and when a dry method is used, the dry method includes exposing the securing structures 28 to an oxygen-containing gas at elevated temperature. An example of a dry method for removing securing structures formed from PMMA is baking in air at a temperature of around 450° C. for a time of 10 to 90 minutes, depending on the PMMA thickness. This dry method is particularly advantageous since it is very selective in removing the PMMA and leaving the graphene. Plasma etching or reactive ion etching treatments in oxygen-containing gases are less preferred since they lack the desired selectivity.

While the present invention has been particularly shown and described with respect to preferred embodiments thereof, it will be understood by those skilled in the art that the foregoing and other changes in forms and details may be made without departing from the spirit and scope of the present invention. For example, the disclosed in-place bonding methods may be used to transfer carbon layers on metal films to an underlying substrate that does not necessarily include an insulating surface layer. It is therefore intended that the present invention not be limited to the exact forms and details described and illustrated, but fall within the scope of the appended claims.

What is claimed is:

1. A method of forming a carbon-on-insulator structure comprising:
   providing an initial structure including an insulating surface layer on a base substrate;
   providing at least one layered metal/carbon (M/C) region on said insulating surface layer, said at least one layered M/C region including an upper patterned carbon layer and a lower patterned metal layer, and said at least one layered M/C region having edges bordered by exposed regions of the insulating surface layer;
   providing securing structures to secure some edges of said at least one layered M/C region to the base substrate, while leaving other edges of said at least one layered M/C region exposed and unsecured, wherein each securing structure comprises a securing material disposed over some portion of the at least one layered M/C region edge and some portions of both the least one layered M/C region and the insulating surface layer directly adjacent the at least one layered M/C region edge;
   selectively removing the patterned metal layer of the at least one layered M/C region by an etching process wherein etchants used have access to the patterned metal layer via the unsecured edges of the at least one layered M/C region; and
   allowing the patterned carbon layer to bond to the insulating surface layer after a desired amount of metal has been removed by the etching process.

2. The method of claim 1 further including the step of removing the securing structures.

3. The method of claim 2 wherein said removing the securing structures includes a process selected from the group of a wet method and a dry method.

4. The method of claim 3 wherein said removing the securing structure includes a wet method comprising dissolution by immersion in an organic or inorganic solvent.

5. The method of claim 3 wherein said removing the securing structure includes a dry method comprising exposure to an oxygen-containing gas at a temperature of around 450° C.

6. The method of claim 1 wherein the bonding of the patterned carbon layer to the insulating surface layer after the desired amount of metal has been removed occurs spontaneously.

7. The method of claim 1 wherein the bonding of the patterned carbon layer to the insulating surface layer after the desired amount of metal has been removed is assisted by an externally applied force.

8. The method of claim 7 wherein said externally applied force includes a pulse of pressurized gas.

9. The method of claim 1 wherein said at least one layered M/C region has a shape selected from the set of shapes including dots, squares, ovals, rings, rectangles, and combinations thereof.

10. The method of claim 1 wherein said securing structures have a shape selected from the set of shapes including dots, squares, ovals, rings, rectangles, and combinations thereof.

11. The method of claim 1 wherein at least one of said securing structures secures the edges of two or more layered M/C regions.

12. The method of claim 1 wherein at least one of said securing structures secures opposing edges of the at least one layered M/C region to the substrate and substantially covers those portions of that layered M/C region lying between said opposing edges, thereby improving the resistance of the M/C and/or carbon layers between the secured edges to stress-induced tearing and breakup that can occur before the metal removal is complete.

13. The method of claim 1 wherein the patterned carbon layer of the at least one layered M/C region being bonded to the insulating surface layer further includes other structures on or in the carbon layer, said other structures are selected from the group including carbon field effect transistors structures, sacrificial protective coatings, and coatings that will become part of a gate dielectric stack.

14. The method of claim 1 wherein said providing the securing structure includes blanket deposition of a securing structure material and patterning.

15. The method of claim 14 wherein said securing structure material is selected from polymethyl methacrylate (PMMA), polydimethylsiloxane (PDMS) and a photoresist.

16. The method of claim 15 wherein said securing structure material is PMMA.

17. The method of claim 1 wherein the etching solution is one of aqueous HCl and aqueous $FeCl_3$.

18. The method of claim 1 wherein said providing at least one layered M/C region includes a subtractive patterning process, an additive patterning process or a combination of a subtractive patterning process and an additive patterning process.

19. The method of claim 1 wherein said upper carbon layer is formed by chemical vapor deposition.

20. The method of claim 1 wherein said upper carbon layer is comprised of graphene.

21. The method of claim 20 wherein said graphene is selected from single-layer graphene, few-layer graphene, multi-layer graphene, a mixture of single-layer, few-layer and multi-layer graphene, any combination of graphene layered mixed with amorphous and/or disordered carbon phases and any combination of graphene incorporating substitutional, interstitial and/or intercalated dopant species.

22. The method of claim 1 wherein said lower metal layer is selected from Co, Cu, Fe, Ir, Mo, Ni, Pt, Ru; alloys of these metals with other elements, other metals and their alloys, layered combinations of said materials, and said metals further including sacrificial underlayers which may or may not be metallic.

23. The method of claim 22 wherein said lower metal layer comprises Ni or Cu.

24. A method of forming a carbon-on-insulator structure comprising:
   providing an initial structure including an insulating surface layer on a base substrate;
   providing at least one layered metal/carbon (M/C) region on said insulating surface layer, said at least one layered M/C region including an upper patterned carbon layer and a lower patterned metal layer, and said at least one layered M/C region having edges bordered by exposed regions of the insulating surface layer;
   providing securing structures to secure all edges of said at least one layered M/C region to the base substrate, wherein each securing structure comprises a securing material disposed over some portion of the at least one layered M/C region edge and some portions of both the least one layered M/C region and the insulating surface layer directly adjacent the at least one layered M/C region edge;
   selectively removing the patterned metal layer of the at least one layered M/C region by an etching process wherein etchants used have access to the patterned metal layer via pores located at least within the patterned carbon layer of the at least one layered M/C region; and
   allowing the patterned carbon layer to bond to the insulating surface layer after a desired amount of metal has been removed by the etching process.

* * * * *